US006501211B1

(12) United States Patent
Nasrollahzadeh

(10) Patent No.: US 6,501,211 B1
(45) Date of Patent: Dec. 31, 2002

(54) ULTRA-SONIC TRANSDUCER ASSEMBLY INCORPORATED INTO A PRINTED CIRCUIT BOARD FOR DETERMINING TENSION FORCES IN A BOLT

(76) Inventor: Masoud Nasrollahzadeh, 4970 Country Side Dr., West Bloomfield, MI (US) 48323

(*) Notice: Subject to any disclaimer, the term of this patent is extended or adjusted under 35 U.S.C. 154(b) by 0 days.

(21) Appl. No.: 09/904,639

(22) Filed: Jul. 13, 2001

(51) Int. Cl.[7] .............................................. H01L 41/08

(52) U.S. Cl. ....................... 310/338; 310/317; 310/328; 310/339

(58) Field of Search ................................ 310/328, 330, 310/332, 334, 336, 338, 339, 317, 319

(56) References Cited

U.S. PATENT DOCUMENTS

| | | | | |
|---|---|---|---|---|
| 2,600,029 A | | 6/1952 | Stone | 73/88.5 |
| 4,114,428 A | | 9/1978 | Popenoe | 73/88 |
| RE30,183 E | | 1/1980 | Popenoe | 73/761 |
| 4,483,181 A | * | 11/1984 | Maekawa et al. | 310/338 X |
| 4,525,644 A | * | 6/1985 | Frohlich | 310/328 |
| 4,598,592 A | * | 7/1986 | McMaster | 310/348 X |
| 4,846,001 A | | 7/1989 | Kibblewhite | 73/761 |
| 4,899,591 A | | 2/1990 | Kibblewhite | 73/761 |
| 5,131,276 A | | 7/1992 | Kibblewhite | 73/761 |
| 5,280,725 A | | 1/1994 | Stengel | 73/761 |
| 5,437,525 A | | 8/1995 | Bras | 411/14 |
| 5,721,380 A | | 2/1998 | Gozlan | 73/761 |
| 5,837,946 A | | 11/1998 | Johnson et al. | 177/136 |
| 6,002,090 A | | 12/1999 | Johnson et al. | 177/136 |

FOREIGN PATENT DOCUMENTS

| | | |
|---|---|---|
| JP | 6-288847 | 10/1994 |

* cited by examiner

*Primary Examiner*—Mark O. Budd
(74) *Attorney, Agent, or Firm*—Gifford, Krass, Groh, Sprinkle, Anderson & Citkowski, P.C.

(57) ABSTRACT

A transducer assembly for use with a remotely located PC device for determining holding forces of a fastener, the fastener including a head and a shaft extending through first and second layers of material. A tightening nut rotatably secures to an extending end of the shaft. The transducer assembly includes a substantially disk-shaped printed circuit board incorporating at least one circuit configuration for communicating first and second faces of the circuit board. An input line, typically a wire harness, extends from the remote PC and is engageable, at a first location, to the first face of the circuit board. A bolt identification component, incorporating either a resistor or ID chip in a suitable circuit, is engageable at a second location to the first face of the circuit board and is communicable, via the input line, with the PC device to communicate a signal representative of the identity of the bolt to be analyzed. A substantially disk shaped piezo-ceramic is engageable with the second face of the circuit board and is encapsulated within a conforming material which also substantially surrounds the second side of the printed circuit board. The identification device and assembly is bonding, through the application of a suitable adherent or glue, atop the fastener head, and in order to be either reusable or disposable at the election of the use.

20 Claims, 7 Drawing Sheets

FIG - 8
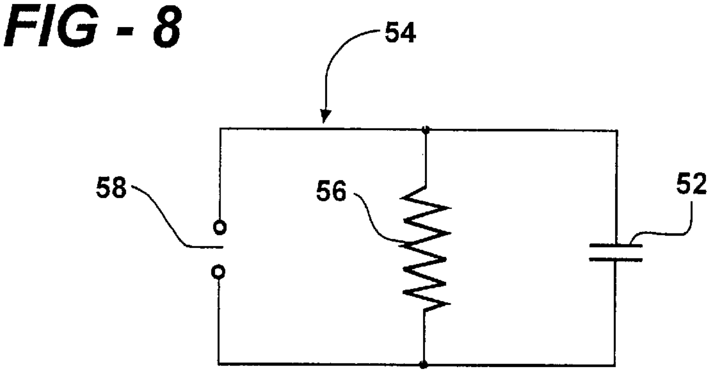
FIG - 9
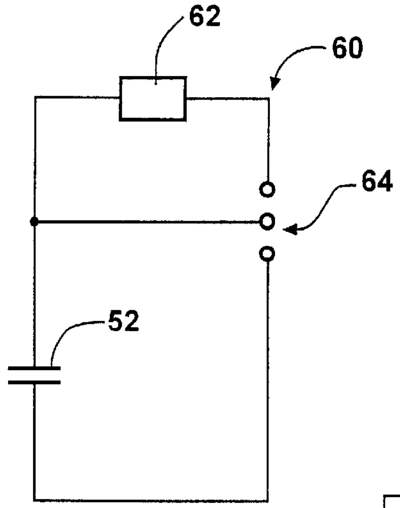
FIG - 10
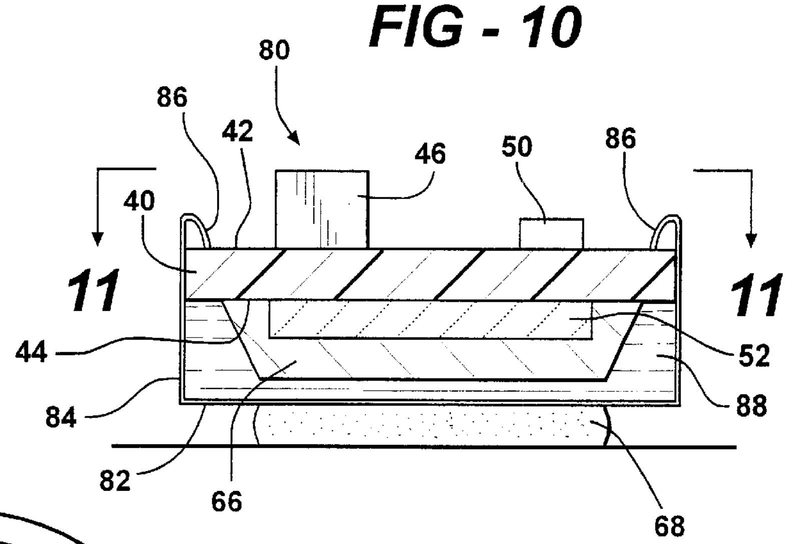
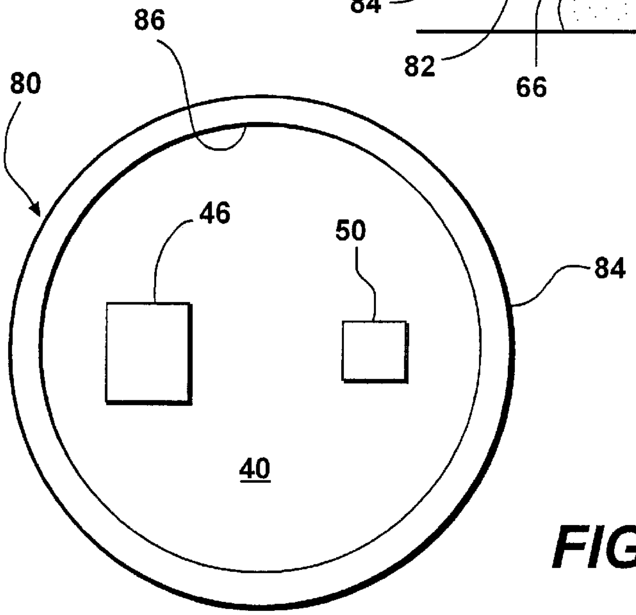
FIG - 11

ULTRA-SONIC TRANSDUCER ASSEMBLY INCORPORATED INTO A PRINTED CIRCUIT BOARD FOR DETERMINING TENSION FORCES IN A BOLT

BACKGROUND OF THE INVENTION

1. Field of the Invention

The present invention relates generally to stress measurement devices for bolt type fasteners. More specifically, the invention discloses an ultrasonic transducer assembly incorporated into a printed circuit board and for determining, specifically during installation or diagnostic testing, tensional holding forces experienced by the bolt during such tightening action. The transducer assembly functions by securing to a head of the fastener and emitting high frequency shock waves (longitudinal and/or transverse waves) through the fastener's axial length. An established flight time, i.e., the time necessary for the ultrasonically created shock wave to travel in forward and return directions along the bolts length, is correlated to a particular level of tension in the bolt. The stress measurement device further provides aspects of reduced expense and disposability not found in the prior art.

2. Description of the Prior Art

Referring to FIGS. 1 and 2 of the illustrations, an example of a prior art and transducer mounted tension measurement device is illustrated at 2. The transducer measurement device 2 includes a substantially steel cylindrical casing 4, typically constructed of a steel and may be surrounded by a magnetic material or other non-magnetic material, and which is secured by a couplant (such as water/glycerine mixture, epoxy, or other suitable type of glue) atop a head 6 of a bolt-type fastener 8. Even in instances where a magnetic casing is employed, it has been found necessary in the prior art to apply a suitable adhesive due to the tendency of the magnetically adhered device to laterally move or "walk" upon the bolt head surface and if not properly affixed in place.

Additional components of the prior art device 2, and referring specifically again to FIG. 2, include a bottom facing wear plate 10, a piezo-ceramic element 12, internal backing material 14, miniature wire harness 16 and connector 18 for communicating the wire harness to the device 2. Not shown is a PC device operatively communicated by an input plug located at a remote end (also not shown) of the wire harness 16.

The bolt 8 typically is employed in a tightening operation to adhere together first 20 and second 22 surfaces and usually includes a first washer 24 (compressed by the bolt head 6 and located on one side of the first surface 22) and a tightening nut 26 (located on an opposite side of the second surface 24) and compressing therebetween a second washer 28. In use, the piezo-ceramic element 12 is energized by a signal from the remote PC and proceeds to emit an ultrasonic wave pattern which travels, in a first direction 30 (see again FIG. 2), the substantial axial length of the bolt fastener 8 and, in a second direction 32, a return length 32.

The connector and associated wire harness of the device 2 transmits a signal represent the combined travel (or "flight") time of the ultrasonic wave along directional arrows 30 and 32 to a software/hardware program (also not shown) incorporated into the PC. The signals correspond to a time shift in the return direction 32. The program incorporates suitable subroutines for correlating the input signal to an output representative of a determined amount of tension or force (exercised upon the bolt in opposite directions 34 and 36) during tightening of the bolt 6. In this fashion, an amount of tension in the bolt can be measured (or if already determined avoided) during both the manufactured assembly or diagnostic applications.

Upon conclusion of the bolt fastener 8 diagnosis, the transducer device 2 is separated from the head 6 by physically overcoming the magnetic attraction between the device 2 and the bolt 8 or, as in many situations where a suitable epoxy is employed, the device 2 is forcibly disengaged from the bolt head 6. The prior art device 2, while providing an effective mechanism for measuring bolt tension, suffers from the shortcoming of its significant cost of construction, which necessitates its repeated reuse with different fasteners. This in turn renders problematic the practical requirement that suitable epoxy and other types of couplant be employed to ensure that the device 2 is securably attached to the bolt hold.

Additional types of ultrasonic load indicating assemblies are known in the art, examples of which are illustrated in U.S. Pat. Nos. 4,899,591; 4,846,001 and 5,131,276, all issued to Kibblewhite, and which teach a thin piezoelectric sensor and method of assembly consisting of a piezoelectric film sandwiched between two thin electrodes. The piezoelectric film is permanently mechanically and acoustically coupled to the upper surface of a member and is used to determine the length, tensile load, stress or other tensile load dependent characteristic of the member by ultrasonic techniques.

U.S. Pat. No. 5,437,525, issued to Bras, teaches an assembly component having a force measuring sensor which includes first and second faces and an axis of symmetry with a ceramic support layer having a mounting side carrying a piezoresistive layer having a resistance that varies in response to its deformation. The force sensor farther includes a central metallic layer and an annular metallic layer joined by the piezoresistive layer or at least two separate sensors having angularly disposed longitudinal axes. A machine for tightening the assembly component includes a motor driven socket for torquing the component in accordance with a sensed tightening tension.

Finally, U.S. Pat. No. 2,600,029, issued to Stone, discloses a stress indicating bolt or stud with a longitudinal bore, within which extend calibrated fine resistance wires. Measurement of bolt stress is achieved by passing an electric current through a series circuit formed by the fine resistance wires and the variations in resistance which are determined are correlated to actual stress experienced by the bolt.

SUMMARY OF THE PRESENT INVENTION

The present invention is an ultrasonic transducer assembly incorporated into a printed circuit board and which is an improvement over prior art devices for measuring the tightening tension experienced by bolt-type fasteners. More particularly, the present invention provides a unique, reduced cost and, at the user's option, disposable tension measurement device. Specifically, the transducer assembly can be less expensively produced employed mass insertion and soldering techniques, more quickly inspected, and more easily applied to a desired bolt fastener. The relative low cost of the transducer assembly, and in particular relative to prior art transducer devices, permits its discard after completion of bolt diagnosis.

The assembly includes a printed circuit board (PCB), preferably manufactured in multiple fashion within in a template layout. Each PCB incorporates at least one circuit configuration for communicating first (top) and second (bottom) faces of the PCB. In a first preferred embodiment, a connector secures to a first location of the first face and bolt identification component, either resistor or ID chip circuits, connects to a second location of the first face. The connector receives an input end of a wire harness extending from a personal computer (PC) or other suitable processing device and, depending upon whether a resistor or multi-bit ID chip employed in the circuit arrangement for electrically communicating with the PC and determining the identity of the bolt to be analyzed, either a two-pin or three-pin connector is used.

By manufacturing the PCB components within the template layout, a multi-port input can be configured at an appropriate location of the template (and by which each input communicates with a specified PCB). A suitable and multi-pin connector extends from the PC and engages the multi-port input. The PC incorporates suitable software for sequentially analyzing each of the PCB units and this is typically accomplished by first submerging the template in a volume of fluid and then by systematically energizing the piezo-ceramic associated with each printed circuit board. In this fashion, the status (good/bad) of each PCB unit can be determined. Break-off points are incorporated between each printed circuit board and the template to enable the PCB to be quickly detached for either disposal (bad) or application (good) in ultrasonic measurement.

Prior to application upon the fastener head, a conforming material, typically a volume of an injected plasticized/resinous material, is applied to the piezo-ceramic and at least substantially the second side of the assembled printed circuit board. In a further application, a substantially annular shape member is employed for insertably engaging the assembled PCB unit and a fluidic couplant may additionally be injected into the annular shaped member prior to engagement of the PCB unit.

The assembled transducer assembly is then secured, with the use of a suitable fluid adherent atop the head of the bolt fastener to be ultrasonically measured. The adherent can also be selected from both conductive and non-conductive materials and examples of suitable adherents include epoxies or glues and it is further contemplated that an adherent exhibiting a specified and lesser holding force (such as provided by weaker adhesives) can be selected depending upon whether the user desires to forcibly disengage the PCB unit from the fastener head for subsequent reuse.

BRIEF DESCRIPTION OF THE DRAWINGS

Reference will now be made to the attached drawings, when read in combination with the following detailed description, wherein like reference numerals refer to like parts throughout the several views, and in which:

FIG. 8 is a schematic illustration of a first type of circuit employed in a resistor identification device and including a two pin connector with piezo-ceramic and resistor in a parallel arrangement;

FIG. 9 is a schematic illustration of a second type of circuit employed in a fastener identification device and including a three pin connector arranged in series with the piezo-ceramic and a multi-bit identification chip;

FIG. 10 is a side cutaway view of the transducer assembly according to a yet further preferred embodiment and in which the printed circuit board and piezo-ceramic are incorporated into a snap-fit boot member;

FIG. 11 is a top view of the transducer illustrated in FIG. 10 and again illustrating the connector and ID/resistor chip;

DETAILED DESCRIPTION OF THE PREFERRED EMBODIMENTS

Figure 1:
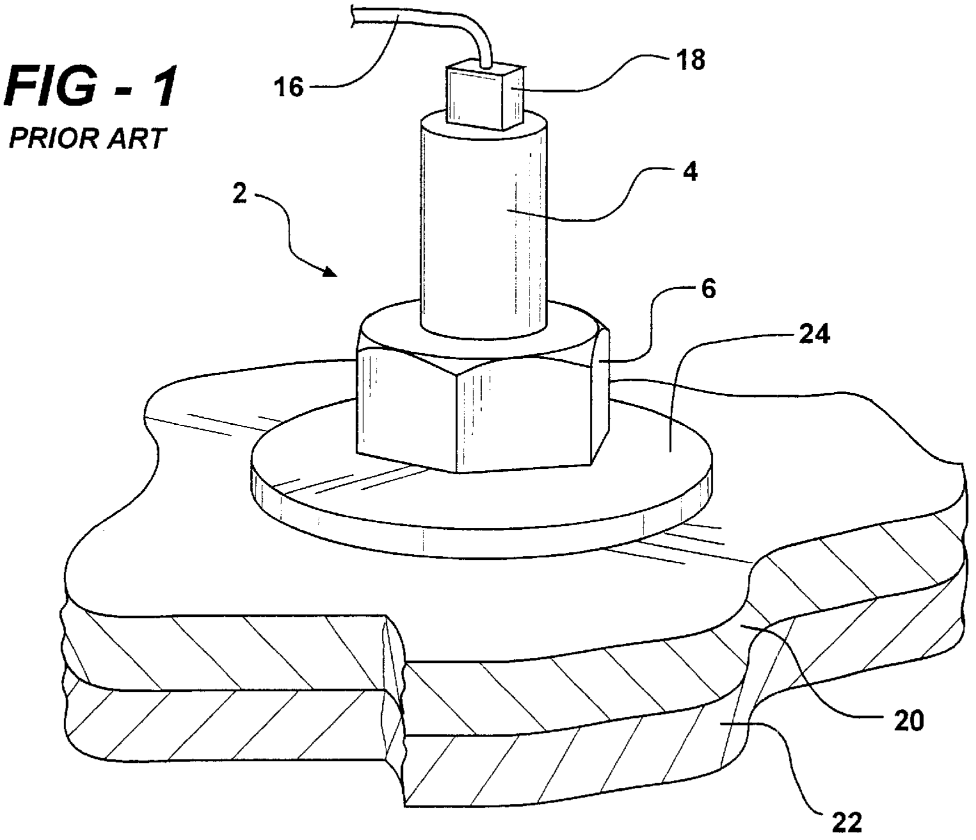
FIG. 1 is a first perspective illustration of a transducer measurement device according to the Prior Art.
Figure 2:
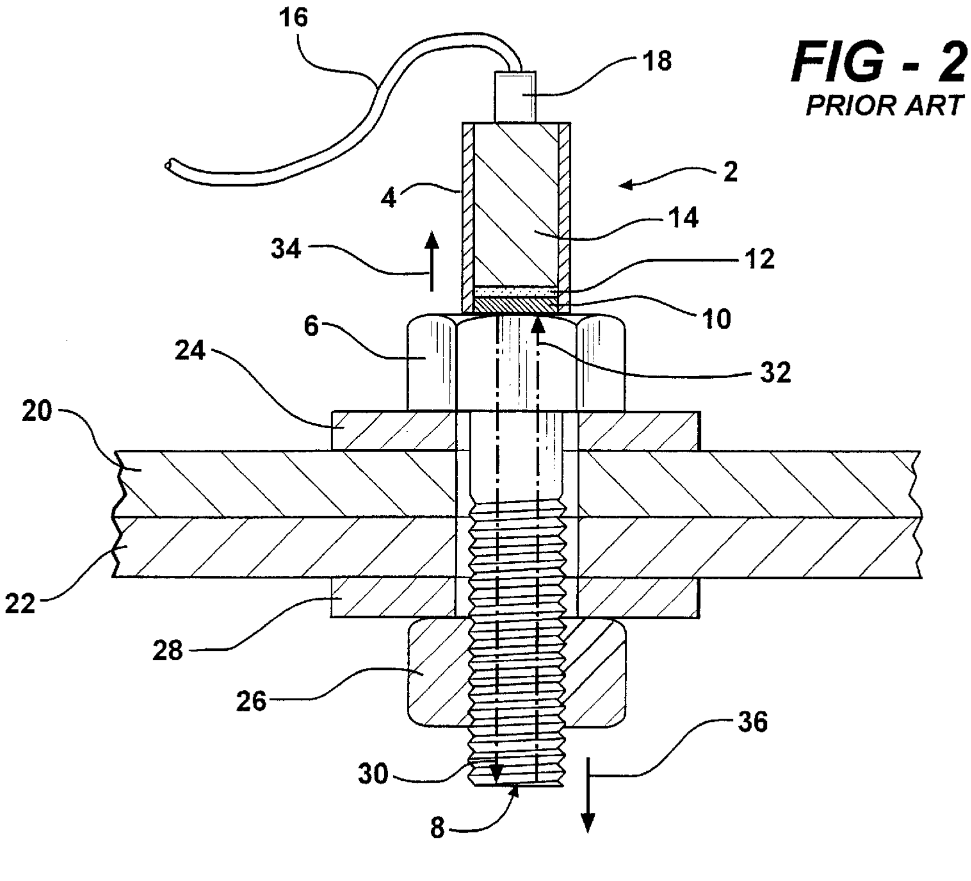
FIG. 2 is a side cutaway device of the Prior Art transducer measurement device according to FIG. 1 and further illustrating the manner in which the device determines bolt tensioning/holding forces during a tightening stage.
Figure 3:
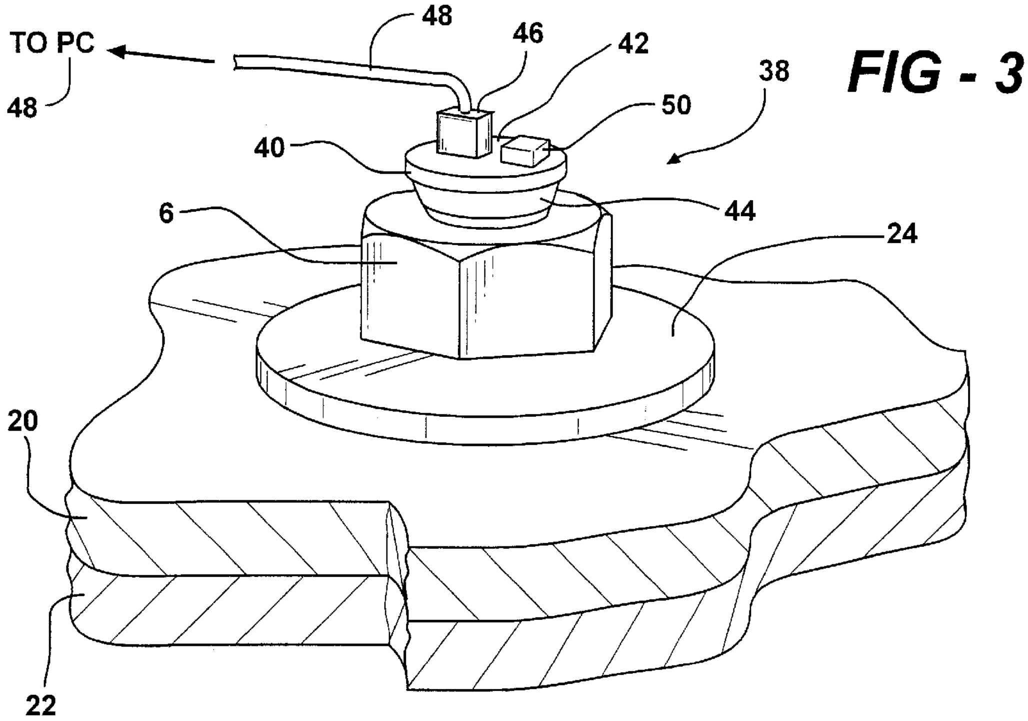
FIG. 3 is a perspective view of the ultrasonic transducer assembly according to a first preferred embodiment of the present invention.
Figure 4:
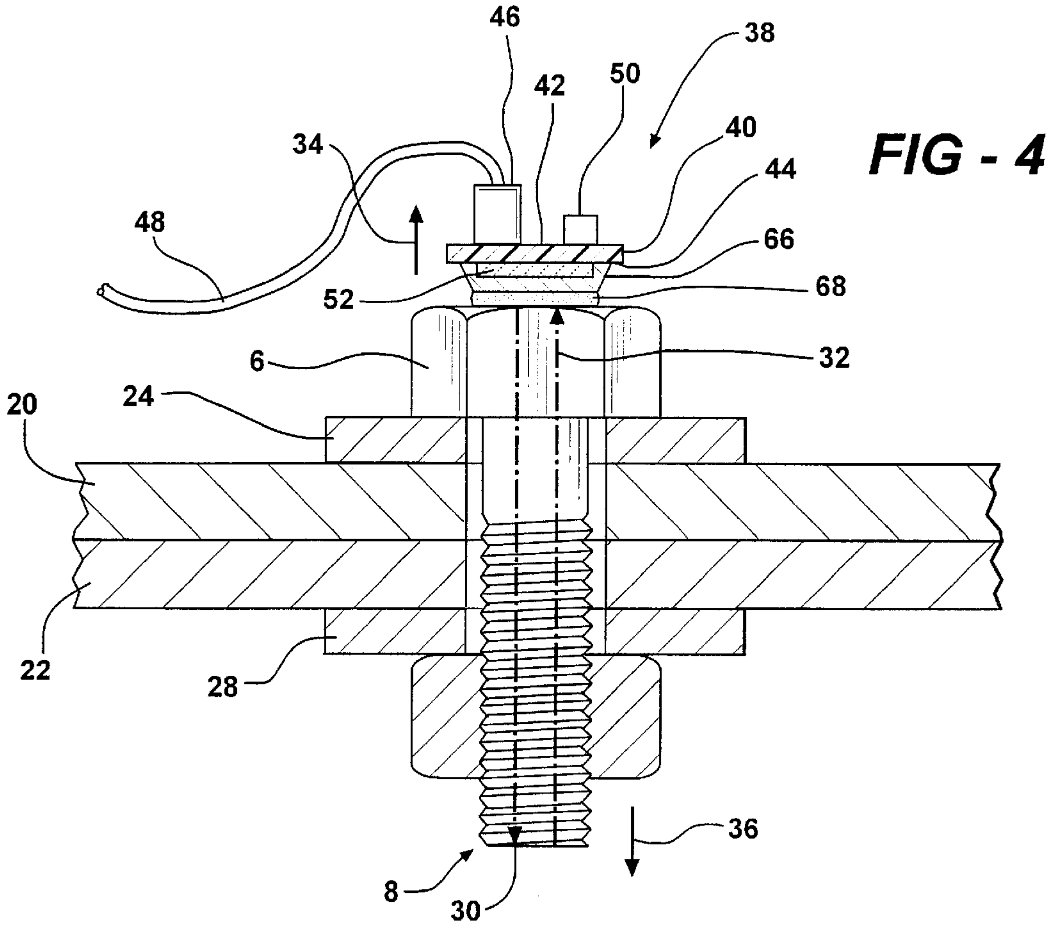
FIG. 4 is a side cutaway view of the transducer assembly illustrated in FIG. 3 and showing in better detail the several components of the assembly, as well as again illustrating the manner in which the ultrasonic device measures bolt tensioning/holding forces.
Figure 5:
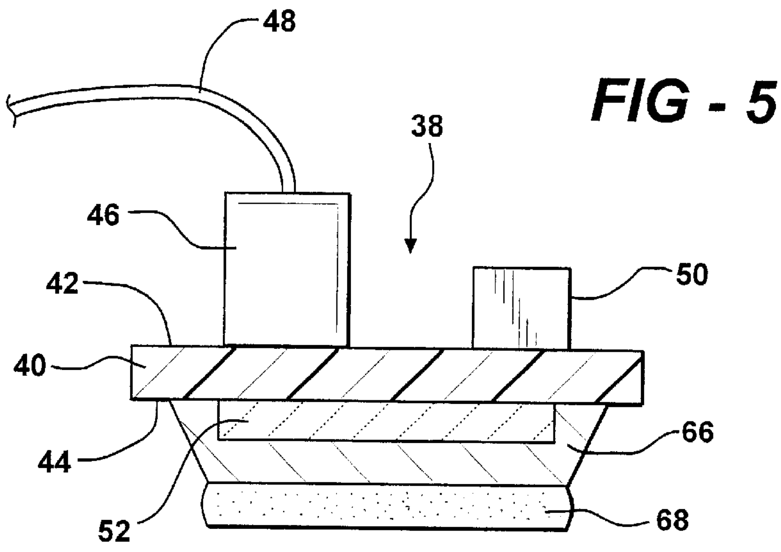
FIG. 5 is an enlarged sectional view of the components of the transducer assembly also shown in FIG. 4.
Figure 6:
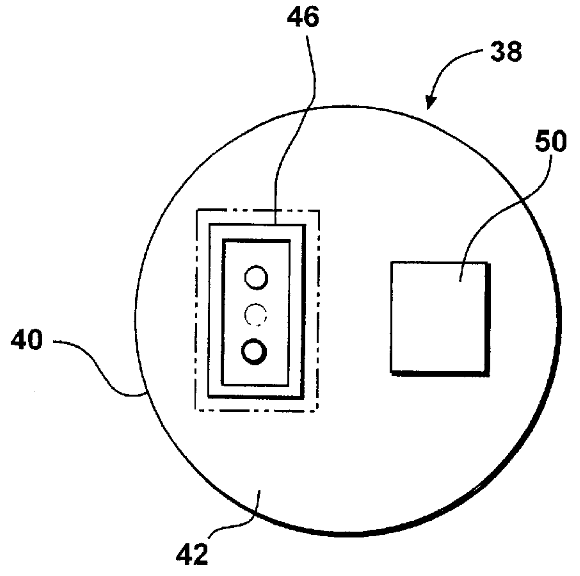
FIG. 6 is a top view of the transducer assembly illustrated in FIG. 5.

Referring now to FIGS. 3–6 in succession, an ultrasonic transducer assembly is illustrated at 38 according to a first preferred embodiment of the present invention and for use with a standard bolt assembly, such as previously described in the Prior Art illustrations FIGS. 1 and 2. As previously described, the present invention is an improvement over prior art devices for measuring the tightening tension experienced by bolt-type fasteners in that it provides a unique, reduced cost and, at the user's option, disposable tension measurement device. As also previously explained, the transducer assembly can be less expensively produced, employing mass insertion and soldering techniques, more quickly inspected, and more easily applied to a desired bolt fastener. The relative low cost of the transducer assembly, and in particular relative to prior art transducer devices, permits its discard after completion of bolt diagnosis at the option of the user.

The construction of the bolt 8 (with bolt head 6) is as previously described in reference to FIG. 2 and typically is employed in a tightening operation to adhere together the first 20 and second 22 surfaces. The bolt 8 again usually includes the first washer 24 (compressed by the bolt head 6 and located on one side of the first surface 22), tightening nut 26 (located on an opposite side of the second surface 24) and compressing therebetween the second washer 28. It is understood that the shape, configuration and application of the elongated fastener and the layers of material is forcibly compresses may vary without departing from the scope of the invention, that being the construction and application of the ultrasonic transducer assembly.

Referring again to FIGS. 3–6, a printed circuit board (PCB) 40 is provided, preferably in the form of a substantially disk-shaped construction exhibiting at least one internal circuit configuration and including a first face 42 and a second face 44. A connector 46 is secured to a first location of the first face 42 of the PCB 40, the connector 46 attaching to a wire harness which extends to an input/output port of a suitable personal computer (PC) or processor (see at 48 in FIG. 3). Although not illustrated, it is further understood that the PC incorporates suitable hardware/software (known in the art) for both testing/diagnosing an assembled unit incorporating the PCB 40, as well as in use determining the tension experienced by the bolt 8 during tightening.

A bolt identification component 50 is engageable at a second location to the first face 42 of the PCB 40, in communication with the circuitry of the PCB, and which functions to electrically communicate, through the wire harness 48 and to the PC, a signal representative of the identity of the bolt to be tension measured. The bolt identification component 50 is also communicable with a piezo-ceramic 52 engaged to the second side 44 of the PCB 40. Specifically, the piezo-ceramic 52 includes two electrodes, which may be located on top and bottom faces, and in which the bottom electrode wraps around (or otherwise communicates) with the top face of the piezo-ceramic. The electrodes associated with the piezo-ceramic (not shown) can be communicated in any desired fashion and so that, upon transmission of an excitation voltage, the piezo initiates vibration and associated time-shift signaling in the manner described. It is also envisioned that a chemically and/or abrasively resistant material is applied to the second face of the PCB 40.

Referring to FIG. 8, a schematic illustration 54 is shown of a first type of circuit employing a resistor 56 connected in parallel to the piezo-ceramic 52, as well as to a connector 58 of a two pin variant. The connector of the resistor 56 to the piezo-ceramic 52 does not affect the signal integrity employed during subsequent ultrasonic actuation and bolt tensioning measurement. The resistor 56 identifies a given resistance of the bolt 8 (upon subsequent assembly of the device atop the bolt head 6) and communicates as a signal this information to the PC. The PC in turn recalls from a memory look up table a value corresponding to the signal and to immediately confirm the identity of the bolt 8.

Referring to 9, a schematic illustration 60 is provided of a second type of circuit employed in a fastener identification device and substitutes the resistor with a multi-bit identification chip 62 (such as a 64 bit chip manufactured by Dallas Semiconductor). The chip 64 is arranged in series with the piezo-ceramic (again at 52) and a three pin variant 64 of a connector, the chip 64 further communicating a signal to the PC corresponding to a given type of bolt fastener 8 and in order to calibrate the PC software for subsequent ultrasonic measurement. Referring also to the top view of FIG. 6, the connector 46 is illustrated in overhead fashion and with either two (solid) pin inputs or three (see additional phantom) inputs total being employed and depending upon the type of bolt identification component (resistor versus ID chip) employed.

Referring again to FIGS. 3, 4, and 5, a conforming material 66 is applied in surrounding fashion to the piezo-ceramic 52 as well as to substantially the second side 44 of the printed circuit board 40. The conforming material 66 protects the piezo-ceramic 52 from the environment and is constructed, in a preferred embodiment, from a volume of an injected and plasticized resin. It is also envisioned that the conforming material 66 may be either conductive or non-conductive in nature.

An adherent material 68 is applied to an underside of the conforming material for securing the assembly 38 atop the bolt head 6. The adherent 68 may be selected from various types of epoxies and glues and it is further envisioned that a degree of holding force exerted by the adherent 68 can be selected in part due to the desire of the user to re-use the assembly 38 or to discard after a given measurement application.

As previously explained in the Prior Art description of FIGS. 1 and 2, the connector 46 and associated wire harness 48 of the device 38 transmits a signal represent the combined travel (or "flight") time of the ultrasonic wave along directional arrows 30 and 32 to the software program incorporated into the PC. The program incorporates suitable subroutines for correlating the input signal to an output representative of a determined amount of tension or force (exercised upon the bolt in opposite directions 34 and 36) during tightening of the bolt 6. In this fashion, a tension in the bolt can be measured during both the manufactured assembly or diagnostic applications.

Figure 7:
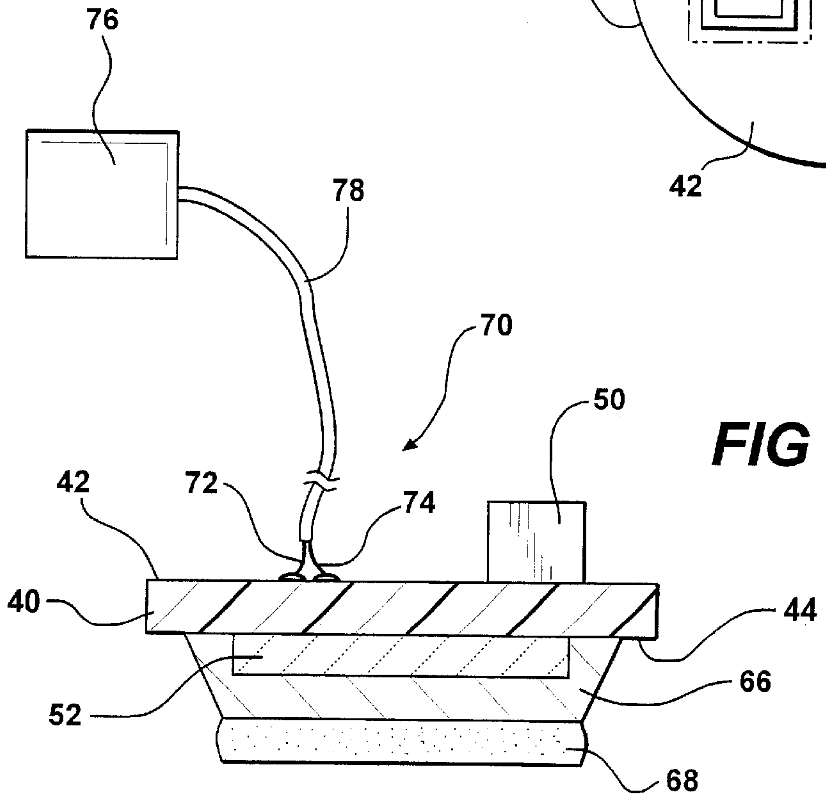
FIG. 7 is a perspective view of the ultrasonic transducer assembly according to a second preferred embodiment of the present invention and illustrating the wires soldered directly to the printed circuit board in a lower height application.

Referring to FIG. 7, a variation 70 of the transducer assembly is shown and in which the connector has been substituted by directly attaching first 72 and second 74 wires (typically by soldering) to the first face 42 of the PCB 40. A variation of the connector 76 can be spaced a distance from the wire ends 72 and 74, along the length of the harness 78, and in instances where the available height above the PCB 40 precludes placement of the connector upon its first face 42.

Referring now to FIGS. 10 and 11, a further embodiment of the assembly is illustrated at 80. The embodiment 80 substantially represents the transducer assembly as previously described with PCB 40, connector 46, identification component 50, piezo-ceramic (sensor) 52 and conforming material 66. The embodiment 80 further discloses a substantially annular shaped member having a base 82 and a continuous side wall 84, the side wall 84 terminating in an interiorly configured lip 86. The lip 86 in turn biasingly engages, in a snap-fit fashion around said printed circuit board 40, piezo-ceramic 52 and conforming material 66, upon insertion within said annular shaped member and in the manner best shown in the side view of FIG. 10.

The annular shaped member may be constructed from a metal or plastic and further exhibits a specified width and height and is constructed from a material selected from the group including plastic and metal. Also disclosed is a volume 88 of a fluidic couplant injected into the annular shaped member (82, 84) prior to engagement of the printed circuit board 40, piezo-ceramic 52 and conforming material 66. The couplant is selected from a group of materials including adhesive, silicone, oil and water and, in combination with the annular shaped member, provides an additional measure of protection to the assembly and the increased ability to reuse the assembly 80 after forcibly disengaging the holding forces exerted by the adherent 68 applied to the bottom face of the annular shaped member.

Figure 12:
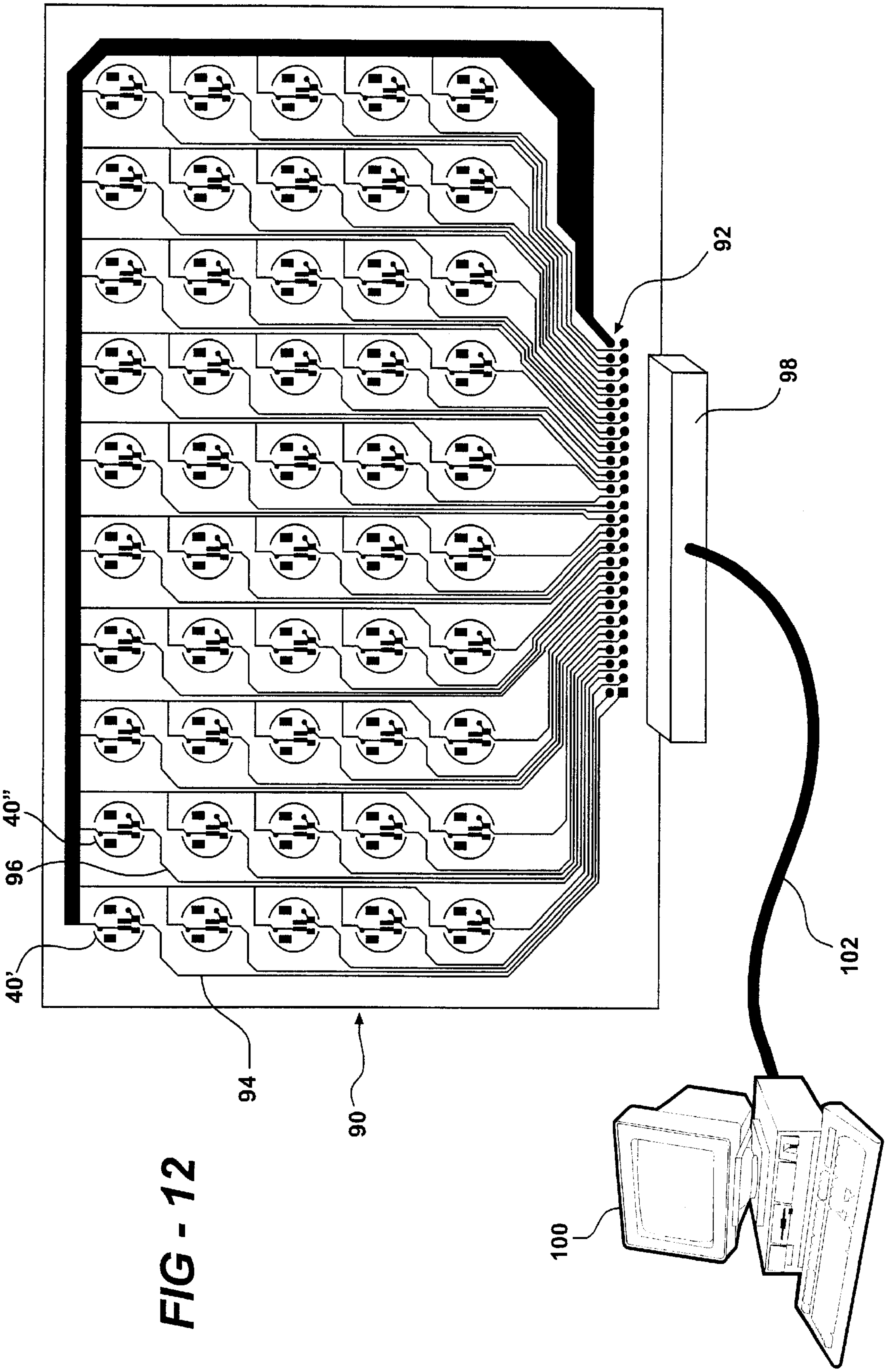
FIG. 12 is an illustration of a template incorporating a plurality of manufactured printed circuit board (PCB) components and further showing a preferred manner in which the PCB components are quickly and simultaneously inspected by a PC device and prior to incorporation into the transducer assembly of the present invention.

Referring to FIG. 12, a template 90 illustrates a plurality of printed circuit board (PCB) units 40', 40", et seq., and which are preferably manufactured in multiple fashion within the template layout. A preferred embodiment contemplates a plurality of 50 individual PCB units (40', 40", et. seq.) manufactured with the connector, bolt identification and piezo-ceramic components. By manufacturing the PCB components within the template layout 90, a multi-port input (see at 92) can be configured at an appropriate location of the template 90 (and by which each input communicates with a specified PCB by a selected communication line, such as at 94 for PCB 40', 96 for PCB 40", et. seq.).

A suitable and multi-pin connector 98 extends from the PC (see also 100) by a communication line 102 and is illustrated in arrayed/spatial fashion relative to the multi-port input 92. The PC 100 incorporates suitable hardware/software for sequentially analyzing each of the PCB units (40', 40", et. seq.) and this is typically accomplished by first submerging the template 90 in a volume of fluid (not shown) and then by systematically energizing the piezo-ceramic associated with each printed circuit board. In this fashion, the status (good/bad) of each PCB unit can be determined.

Figure 13:
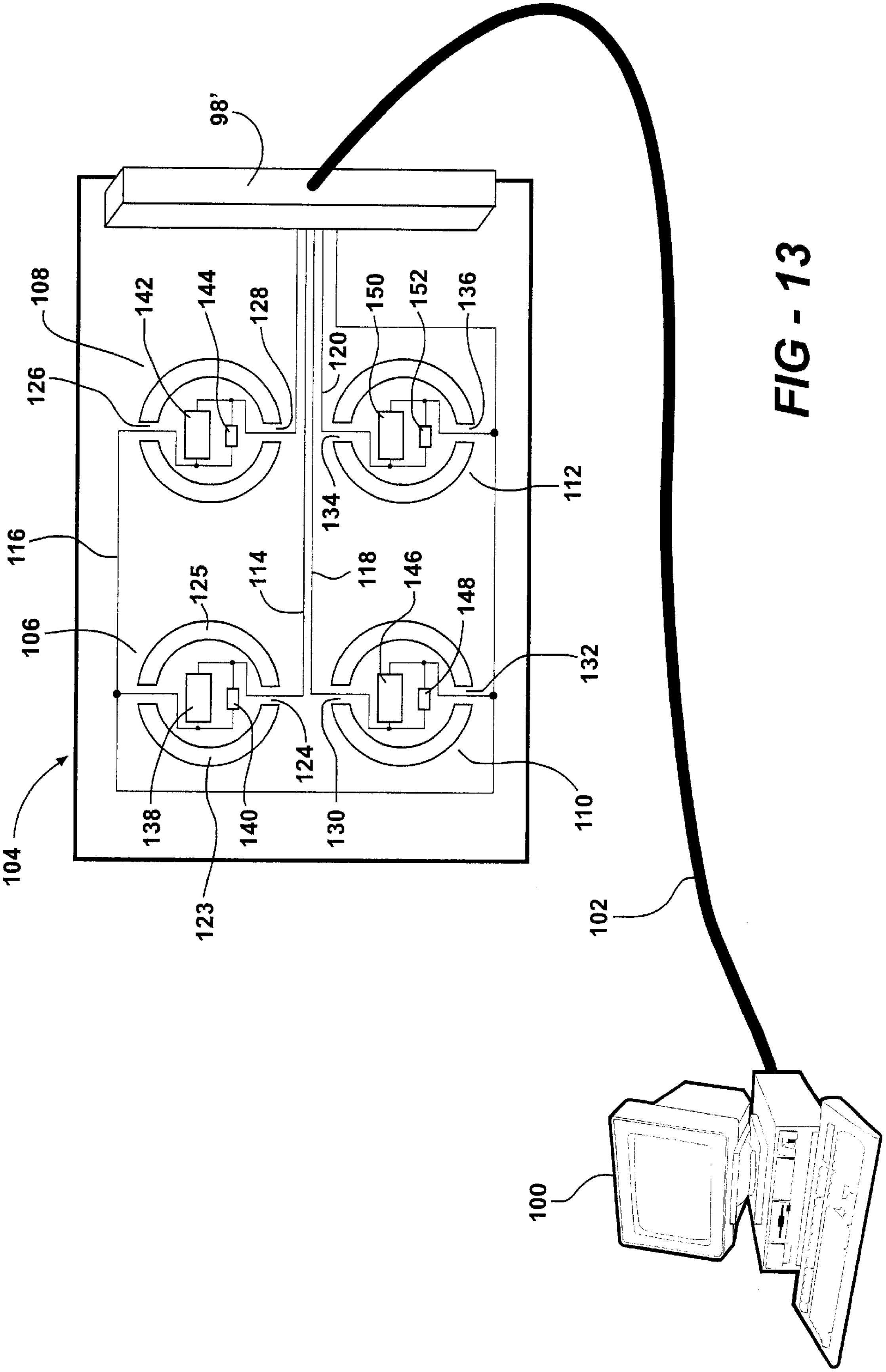
FIG. 13 is an enlarged illustration of a portion of a PCB template and further showing the frangible nature of the individual PCB components by virtue of break-off points incorporated into the template design.

Referring further to FIG. 13, an enlarged illustration is shown of a template 104 in which the PCB units include break-off points incorporated between each printed circuit board and the template 104 to enable the PCB to be quickly detached for either disposal (bad) or application (good) in ultrasonic measurement. In the preferred embodiment, a template illustrating a full array of PCB units is provided (such as in FIG. 12); however, and for convenience of illustration, the reduced sized template 104 is shown for purposes of ease of description. Specifically, a variation of the multi-pin connector is shown at 98' (again designed to correspond to a given number of input ports in turn associating with the number of PCB units (see at 106, 108, 110 and 112 and by virtue of communication lines 114, 116, 118 and 120, respectively) associated with the template layout 104. The frangible or break-off connections are shown at 122 and 124 by example for first PCB unit 106, separated by arcuate and extending open channels 123 and 125. Additional pairs of connections 126 and 128, 130 and 132, and 134 and 136 associate with each succeeding PCB unit 108, 110 and 112, each with associated pairs of arcuate channels to assist in the frangibility (breakability of the PCB unit). Referring again to selected PCB unit 106, connector 138 and resistor/ID chip 140 are shown, the piezo-ceramic sensor being hidden from view on the reverse side. Additional pairs of connectors and resistor/ID chips are shown at 142 and 144, 146 and 148, and 150 and 152, respectively for PCB units 108, 110 and 112.

The present invention therefore provides a transducer assembly which is less expensive and more convenient to produce. The PCB units further provide predictable and uniform performance characteristics and the PC board acts as a damper to filter out back reflections from the circuit board. The assembly further provides lower height requirements than which is typical of prior art transducer devices and the disposability aspect is a further distinct advantage over more expensive prior art devices.

Having described my invention, additional preferred embodiments will become apparent to those skilled in the art to which it pertains and without departing from the scope of the invention.

Figure 14:
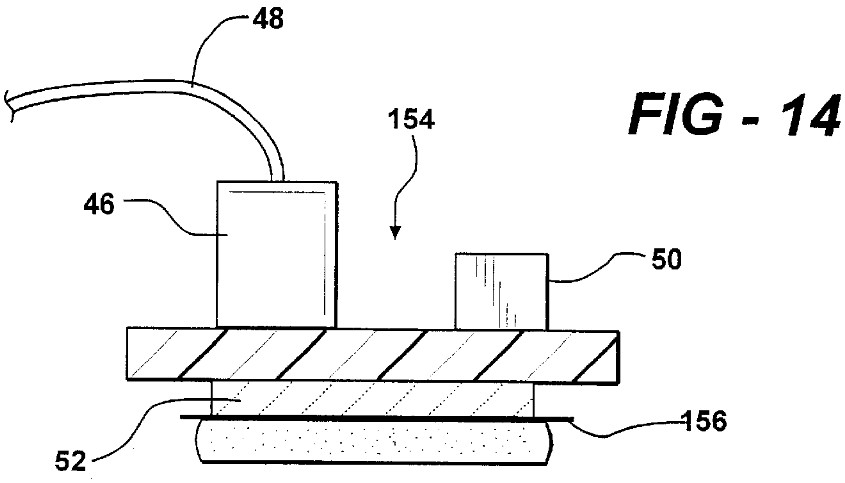
FIG. 14 is a view similar to that shown in FIG. 5 and substituting the conforming layer with the thin sheet of ultrasonically conducting material according to the present invention.

Specifically, the conforming material or the annular boot-member previously disclosed can be substituted by an ultrasonically conducting material of any type, and which may include a thin and planar sheet of any suitable type of material (metal or plastic) glued or otherwise secured to the bottom exposed face of the piezo-ceramic 52. Reference is specifically made to FIG. 14 at 154, and which includes planar sheet of material 156, understood to replace the conforming material 66 (or annular member 84 in FIG. 10).

Figure 15:
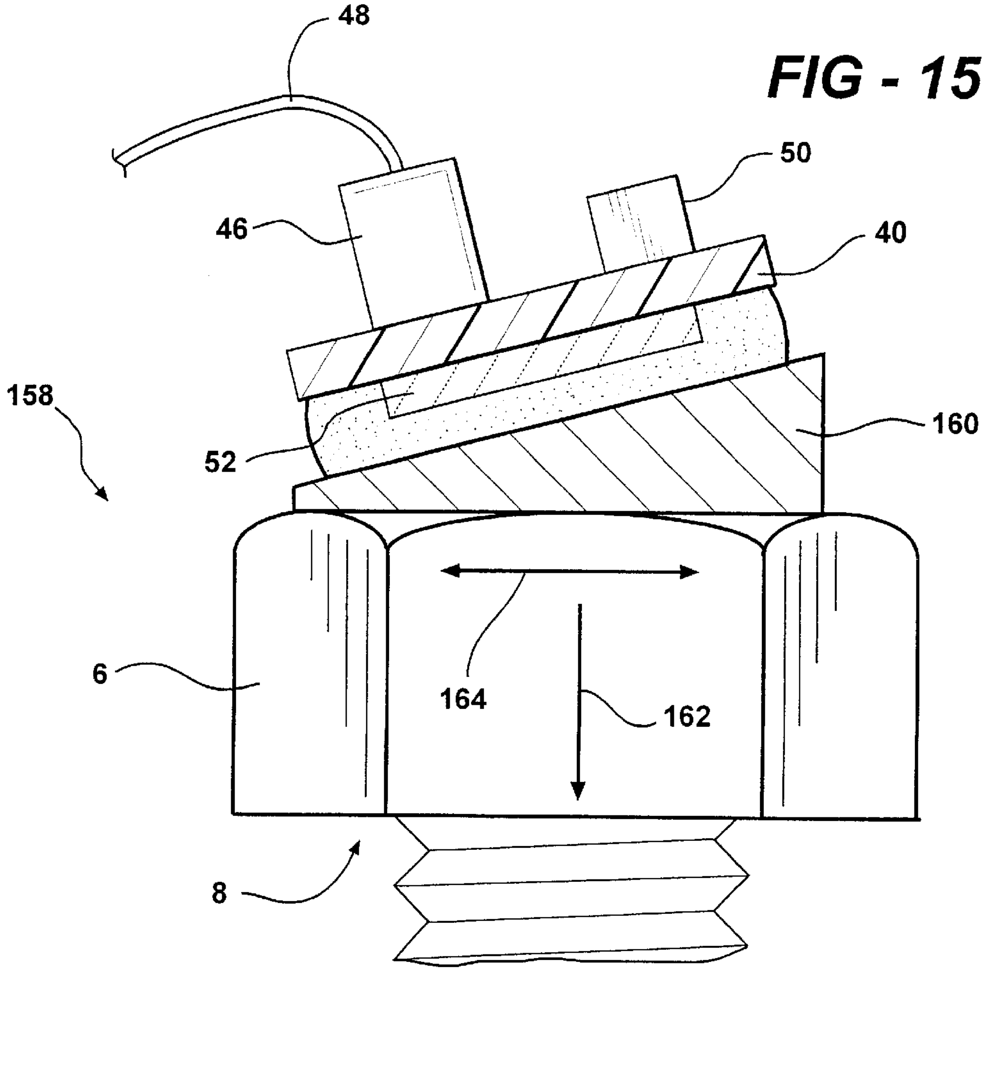
FIG. 15 illustrates an alternate configuration of FIG. 14 and in which the ultrasonically conducting material includes a wedge-shaped thickness.

Referring to FIG. 15, an illustration 158 is shown of a thickened and wedge-shaped ultrasonically conducting layer 160, in use with the transducer assembly. The purpose of the wedge-shaped layer 160 is to angle the piezo-ceramic 52 relative to the top face of the engageable fastener head 6 and so that the direction of the signal emitted from the piezo-ceramic 52 is adjustable to target a specific portion of the bolt in which tension measurement is desired. Alternately, the wedge layer 160 enables the creation of two (longitudinal and transverse) waves. The waves, see at 162 and 164, enable measurement of different properties of the fastener, such as torque and the like. By example a urethane coating can be substituted by a non-metallic wear plate constructed of an aluminum oxide material.

I claim:

1. A transducer assembly for use with a remotely located PC device for determining holding forces of a fastener, the fastener including a head and a shaft extending therefrom and through first and second layers of material, a tightening nut rotatably securing to an extending end of the shaft, said transducer assembly comprising:

a printed circuit board incorporating at least one circuit configuration, said circuit board including a first face and a second face;

an input line extending from the remote PC and secured at a first location of said first face of said circuit board;

a bolt identification component secured at a second location to said first face of said circuit board and communicating, via said input line, with the PC device;

a piezo ceramic secured to said second face of said circuit board;

a conforming material surrounding said piezo ceramic and at least substantially said second side of said printed circuit board; and bonding means for adhering said printed circuit board, piezo ceramic and conforming material atop the fastener head.

2. The transducer assembly as described in claim 1, said input line further including a wire harness and further comprising a connector within which is engaged said input line.

3. The transducer assembly as described in claim 1, said input line further comprising first and second wires solderable in communication with said circuit configuration of said printed circuit board.

4. The transducer assembly as described in claim 2, said connector further comprising a two pin connector, said bolt identification component further comprising a circuit with a resistor arranged in parallel with said piezo-ceramic identification device and said two pin connector.

5. The transducer assembly as described in claim 2, said connector further comprising a three pin connector, said bolt identification component further comprising a circuit with a multi-bit identification chip arranged in series with said piezo-ceramic and said three pin connector.

6. The transducer assembly as described in claim 1, said conforming material further comprising a volume of an injected and plasticized resin.

7. The transducer assembly as described in claim 6, further comprising a substantially annular shaped member having a base and a continuous side wall, said side wall terminating in an interiorly configured lip which biasingly engages in a snap-fit fashion around said printed circuit board, piezo-ceramic and conforming material upon insertion within said annular shaped member.

8. The transducer assembly as described in claim 7, said annular shaped member having a specified width and height and being constructed from a material selected from the group including plastic and metal.

9. The transducer assembly as described in claim 7, further comprising a volume of a fluidic couplant injected into said annular shaped member prior to engagement of said circuit board, piezo-ceramic and conforming material.

10. The transducer assembly as described in claim 9, said couplant being selected from the group including silicone, oil and water.

11. The transducer assembly as described in claim 7, said bonding means further comprising an adherent applied to an underside surface of said annular shaped member.

12. The transducer assembly as described in claim 9, said adherent further comprising a fluidic material selected from the group including epoxies and glues.

13. The transducer assembly as described in claim 1, said bonding means further comprising an adherent applied to an underside surface of said conforming material.

14. The transducer assembly as described in claim 13, said adherent further comprising a fluidic material selected from the group including epoxies and glues.

15. The transducer assembly as described in claim 14, said adherent material further being selected from a group including conductive and non-conductive materials.

16. The transducer assembly as described in claim 1, further comprising a chemically and/or abrasion resistant material applied to a bottom surface of said second face of said printed circuit board.

17. The transducer assembly as described in claim 2, further comprising a plurality of said printed circuit boards, with associated PC input, bolt identification and piezo-ceramic components, said circuit boards being manufactured in a template layout.

18. The transducer assembly as described in claim 17, said template further comprising an multi-port input corresponding with a s elected number of said printed circuit boards to be inspected, a suitable multi-pin connector extending from the PC and engaging said multi-port input to inspect said plurality of printed circuit boards.

19. The transducer assembly as described in claim 18, said template further comprising break-off points for individually detaching each of said printed circuit boards.

20. A transducer device for determining holding forces of a bolt-type fastener, the fastener including a fastener head, said transducer device comprising:

a substantially disk-shaped circuit board incorporating at least one circuit configuration, said circuit board including a first face and a second face;

an input wire harness extending from a remote PC and secured, at a first location, to said first face of said circuit board;

a bolt identification component secured at a second location to said first face of said circuit board and communicating, via said input line, with the PC device;

a substantially disk-shaped piezo ceramic secured to said second face of said circuit board;

a conforming material surrounding said piezo ceramic and at least substantially said second side of said printed circuit board; and an adhering material applied to an opposing face of said conforming material to affix said transducer device atop the fastener head.

* * * * *